(12) United States Patent
Chen

(10) Patent No.: US 8,162,673 B2
(45) Date of Patent: Apr. 24, 2012

(54) ELECTROMAGNETIC INTERFERENCE SPRING CONTACT FOR SHIELDING ELECTROMAGNETIC INTERFERENCE AND ELECTRONIC DEVICE USING SAME

(75) Inventor: Song-Ya Chen, Shenzhen (CN)

(73) Assignees: Fu Tai Hua Industry (Shenzhen) Co., Ltd., ShenZhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 49 days.

(21) Appl. No.: 12/876,157

(22) Filed: Sep. 5, 2010

(65) Prior Publication Data
US 2011/0223779 A1     Sep. 15, 2011

(30) Foreign Application Priority Data
Mar. 12, 2010   (CN) .......................... 2010 1 0123309

(51) Int. Cl.
*H01R 12/00*   (2006.01)
*H05K 1/00*    (2006.01)
(52) U.S. Cl. ......................................... 439/66; 439/862

(58) Field of Classification Search ............... 439/66, 439/65, 862, 884
See application file for complete search history.

(56) References Cited

U.S. PATENT DOCUMENTS
7,803,011 B1 * 9/2010 Mai .............................. 439/500
7,806,739 B2 * 10/2010 Hu et al. ....................... 439/862
2006/0276085 A1 * 12/2006 Ma et al. ....................... 439/862
* cited by examiner

*Primary Examiner* — Hae Moon Hyeon
(74) *Attorney, Agent, or Firm* — Altis Law Group, Inc.

(57) ABSTRACT

An EMI spring contact for shielding EMI comprises a first section having a first end and a second end opposite to the first end, a second section connected to the first section and extending up and angularly from the first end of the first section, a third section connected to the second section and extending down from the second section, and a fourth section connected to the third section. An acute angle is formed between the first and second sections, and a first through hole is defined in the second section. The fourth section extends up and angularly from the third section through the first through hole of the second section and is movably received in the first through hole.

15 Claims, 6 Drawing Sheets

ELECTROMAGNETIC INTERFERENCE SPRING CONTACT FOR SHIELDING ELECTROMAGNETIC INTERFERENCE AND ELECTRONIC DEVICE USING SAME

BACKGROUND

1. Technical Field

The present disclosure relates to an electro-magnetic interference (EMI) spring contact for shielding against EMI.

2. Description of Related Art

EMI spring contacts are known in the art, they are used between a circuit board assembly and a conductive member of the electronic device. Most of the time the EMI spring contacts are connected to the circuit board assembly by screws. Nowadays, electronic devices are designed with more and more complexity, and two or more circuit board assemblies may be used. So, two or more EMI spring contacts are needed to connect the circuit board assemblies by screws which is inconvenient.

Therefore, there is room for improvement in the art.

BRIEF DESCRIPTION OF THE DRAWINGS

The components in the drawings are not necessarily drawn to scale, the emphasis instead being placed upon clearly illustrating the principles of the EMI spring contacts. Moreover, in the drawings, like reference numerals designate corresponding parts throughout the several views.

DETAILED DESCRIPTION

Embodiments of the present disclosure will now be described in detail below, with reference to the accompanying drawings.

Figure 1:
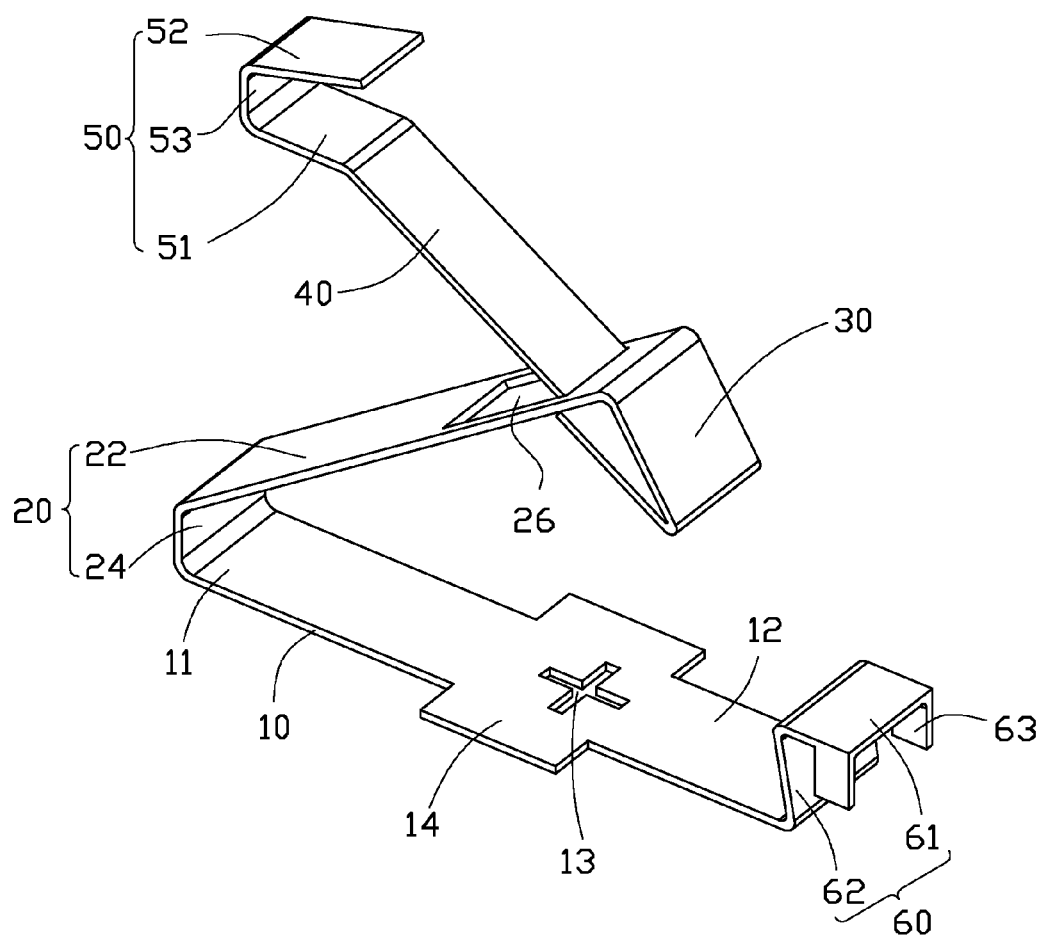
FIG. 1 is a perspective view of an EMI spring contact in accordance with an exemplary embodiment.

Referring to FIG. 1, an EMI spring contact 100 according to an exemplary embodiment is illustrated. The EMI spring contact 100 includes a first section 10 having a first end 11 and a second end 12 opposite to the first end 11, a second section 20 connected to the first section 10 and extending up and angularly from the first end 11 of the first section 10, a third section 30 connected to the second section 20 and extending down from the second section 20, a fourth section 40 connected to the third section 30 and extending up and angularly from the third section 30, a fifth section 50 connected to the fourth section 40 and a sixth section 60 connected to the second end 12 of the first section 10.

The first section 10 may be strip shaped. A first crisscross through hole 13 is defined in the center of the first section 10. The first through hole 13 is configured to accommodate solder to fix the EMI spring contact 100 on other objects more firmly. In the embodiment, other objects may be a circuit board assembly or a conductive member of an electronic device. The first section 10 further includes two first extending sections 14 defined respectively on the two opposite sides of the first through hole 13. Because of the two first extending sections 14, the contacting area between the first section 10 and other object increases, and the EMI spring contact 100 may be connected with other object better.

The second section 20 includes a supporting section 22 and a first connecting section 24 connecting the supporting section 22 with the first end 11 of the first section 10. The first connecting section 24 extends vertically from the first end 11 of the first section 10. The angle between the first connecting section 24 and the first section 10 can be a random value between 0 and 90 degrees. In the embodiment, the angle is 90 degrees. The supporting section 22 extends up and angularly from the first connecting section 24. A second through hole 26 is defined on one end of the supporting section 22 away from the first connecting section 24. The second through hole 26 may be rectangular shaped. The angle between the supporting section 22 and the first section 10 is less than the angle between the first connecting section 24 and the first section 10, to make the supporting section 22 resist the pressure from other objects. The angle between the supporting section 22 and the first section 10 is approximately 45 degrees.

The third section 30 extends down and angularly from one end of the supporting section 22. While the EMI spring contact 100 is in an idle state, the angle between the third section 30 and the supporting section 22 may be 90 degrees.

The fourth section 40 extends up and angularly from the third section 30 through the second through hole 26 of the supporting section 22. The fourth section 40 is movably received in the second through hole 26.

The fifth section 50 includes a first contact section 51, a second contact section 52 and a second connecting section 53 connecting the first contact section 51 and the second contact section 52. The first contact section 51 extends out and horizontally from the fourth section 40. The first contact section 51 is approximately parallel to the first section 10. The second connecting section 53 extends vertically from the first contact section 51. The angle between the second connecting section 53 and the first contact section 51 can be a random value between 0 and 90 degrees. In the embodiment, the angle is 90 degrees. The second contact section 52 extends up and angularly from the second connecting section 53. The angle between the second contact section 52 and the second connecting section 53 is somewhat more than 90 degrees. The second contact section 52 is associated with the first contact section 51 to support another object.

The sixth section 60 includes a third contact section 61 and a third connecting section 62 connecting the third contact section 61 with the second end 12 of the first section 10. The third connecting section 62 extends up and angularly from the second end 12 of the first section 10. The angle between the third connecting section 62 and the first section 10 can be a random value between 0 and 180 degrees. In the embodiment, the angle is approximately 75 degrees. The third contact section 61 extends out from the third connecting section 62 and the third contact section 61 is substantially parallel to the first section 10. Two second extending sections 63 vertically extend downwards from the two end sides of the third contact section 61 respectively.

When the EMI spring contact 100 is used to reduce the EMI between a circuit board assembly and a conductive member of the electronic device, the EMI spring contact 100 may be pressed against the circuit board assembly. With the sliding of the fourth section 40 in the second through hole 26, the angle between the supporting section 22 and the third section 30 and the angle between the third section 30 and the fourth section 40 can change and make sure that the EMI spring contact 100 can be stably connected to each of the circuit board assemblies. Thus, the electronic device can be shielded from EMI.

Figure 2:
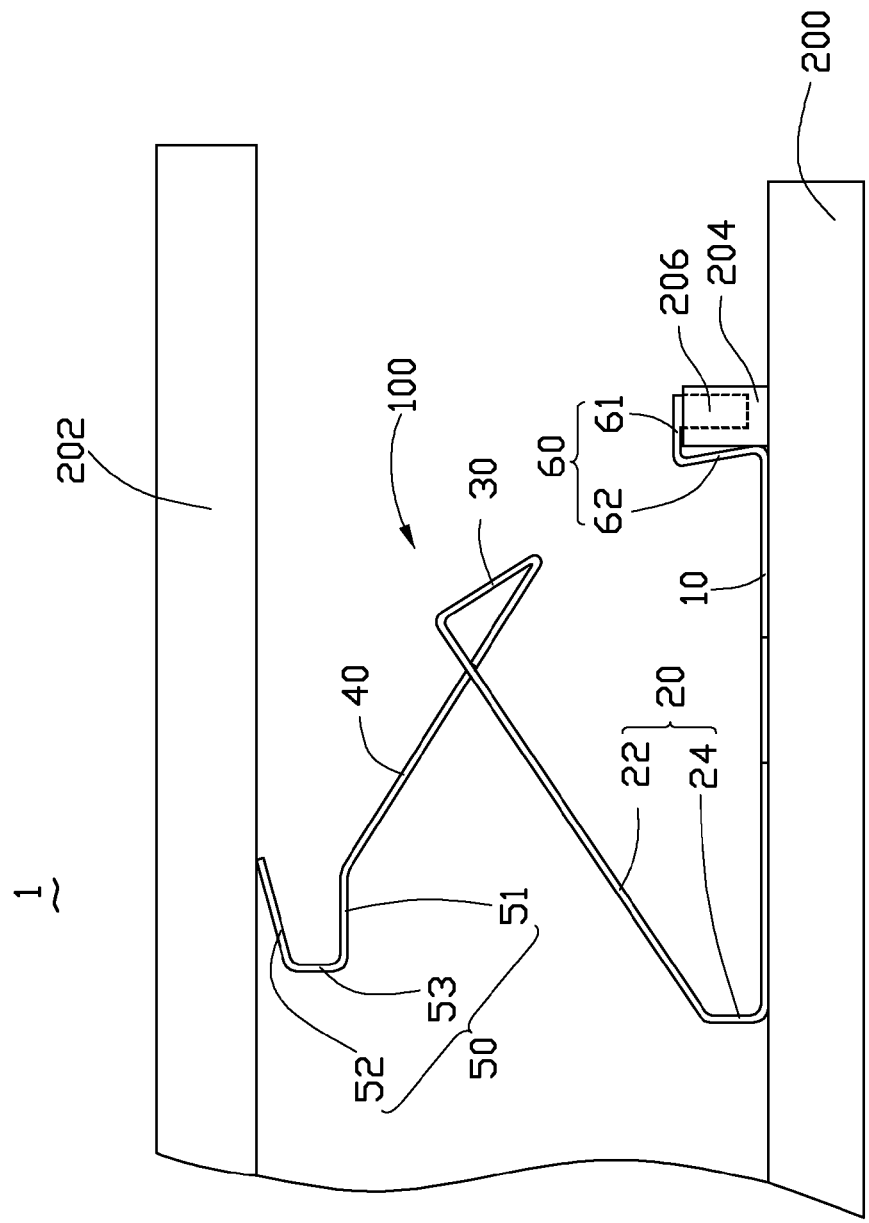
FIG. 2 is a side view of an electronic device including the EMI spring contact of FIG. 1 in a first state.
Figure 3:
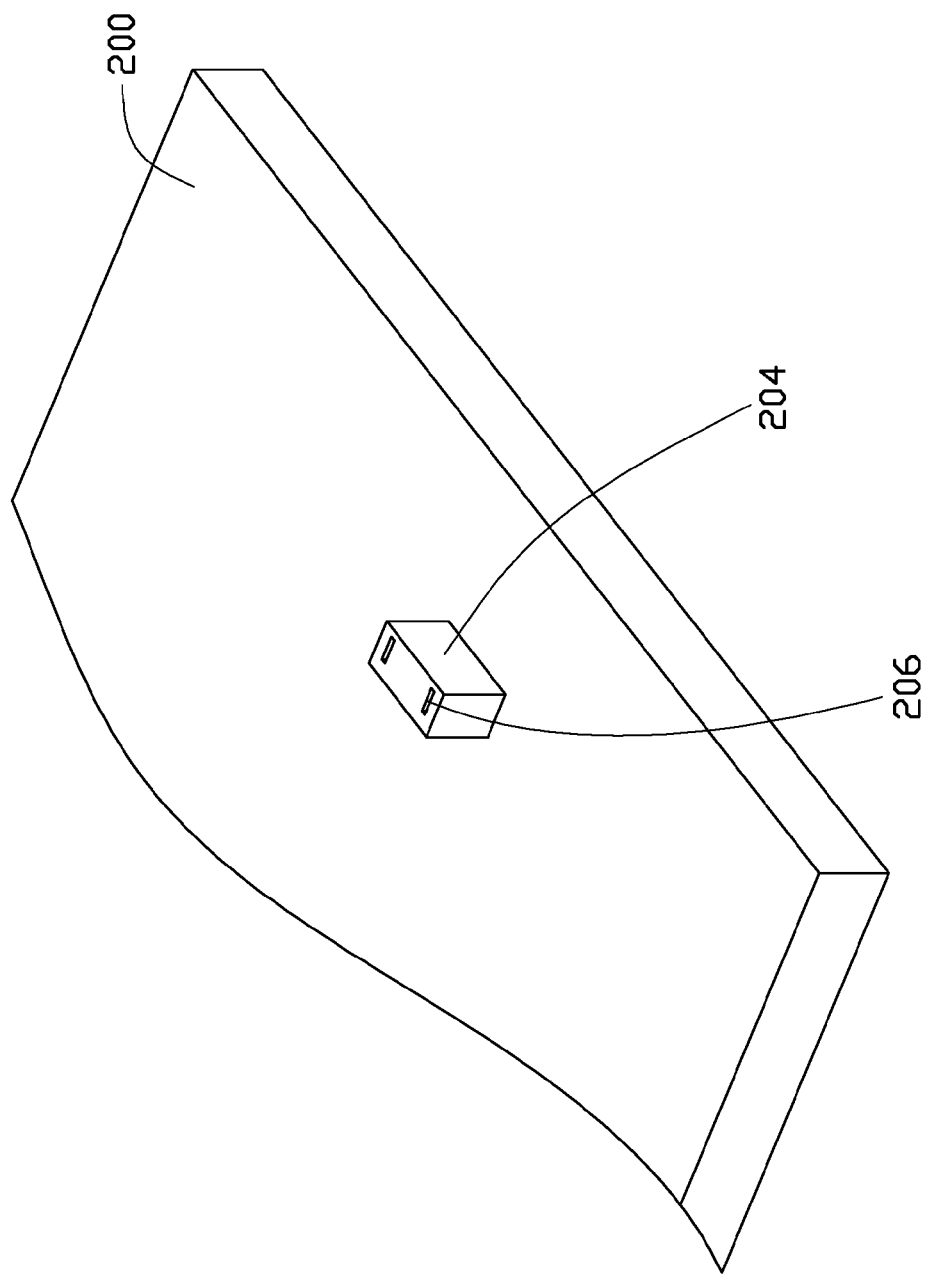
FIG. 3 is a partial, enlarged view of the circuit board assembly of FIG. 2.

Referring to FIG. 2, in a first state, an electronic device 1 includes a first circuit board assembly 200, a second circuit board assembly 202 and the EMI spring contact 100 connecting between the first circuit board assembly 200 and the second circuit board assembly 202. The first section 10 of the EMI spring contact 100 is horizontally mounted on the first circuit board assembly 200. The second contact section 52 abuts against the second circuit board assembly 202 which is parallel to the first circuit board assembly 200. Referring to FIG. 3, a third extending section 204 is disposed on a surface of the first circuit board assembly 200 and extends up from the surface of the first circuit board assembly 200. The third extending section 204 may be cuboid shaped. Two first grooves 206 are defined in the top surface of the third extending section 204. The two second extending sections 63 of the EMI spring contact 100 are respectively plugged in the two first grooves 206 to connect the EMI spring contact 100 to the first circuit board assembly 200.

Figure 4:
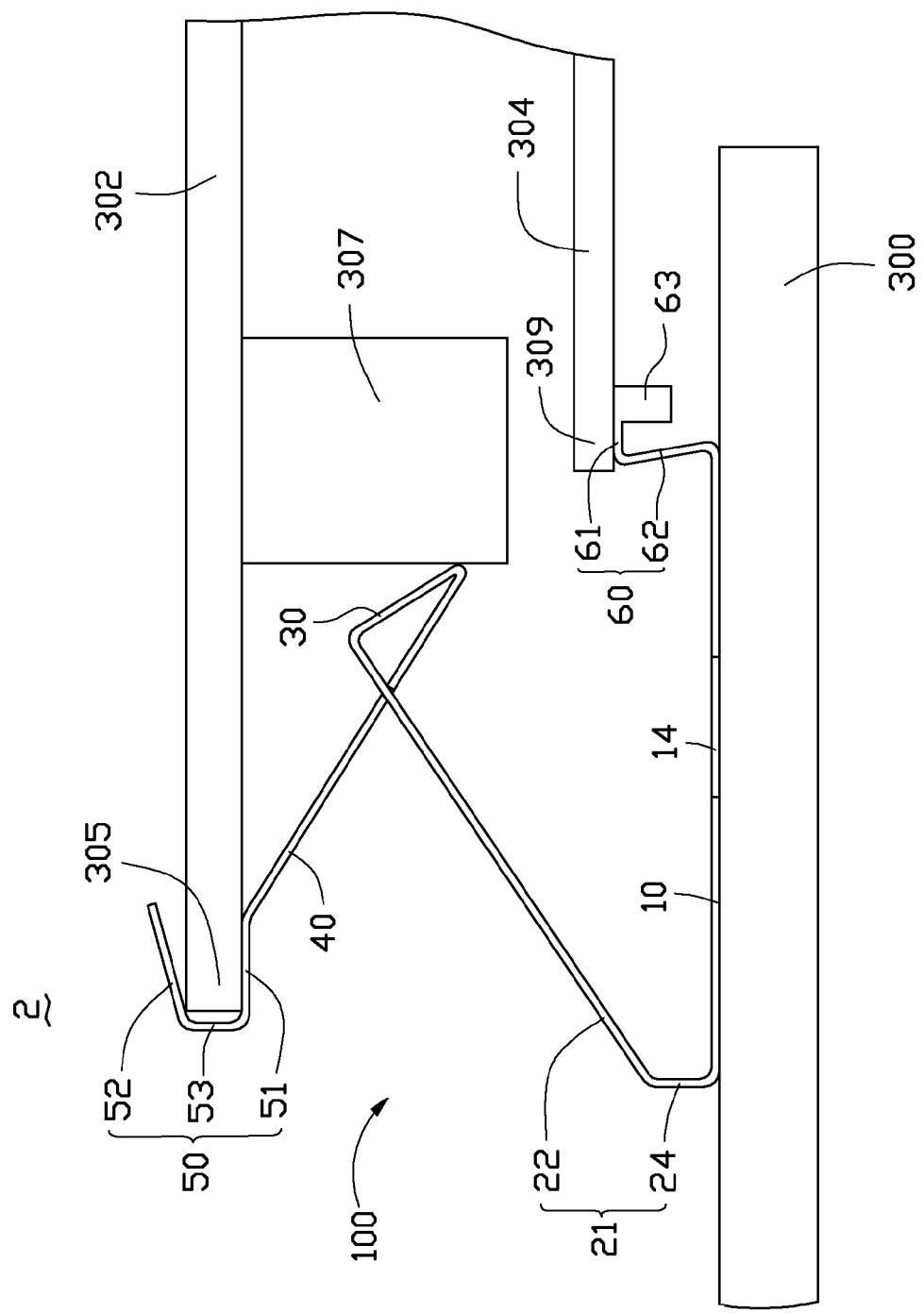
FIG. 4 is similar to FIG. 2, but showing an electronic device including the EMI spring contact of FIG. 1 in a second state.

Referring to FIG. 4, in a second state, an electronic device 2 includes a first circuit board assembly 300, a second circuit board assembly 302, a third circuit board assembly 304 and the EMI spring contact 100 connecting the first circuit board assembly 300 and the second circuit board assembly 302 and the third circuit board assembly. The first section 10 of the EMI spring contact 100 is horizontally mounted on the first circuit board assembly 300, and solder is accommodated in the first through hole 13 to make the EMI spring contact 100 be connected to the first circuit board assembly 300. The first contact section 51 is associated with the second contact section 52 to hold one end 305 of the second circuit board assembly 302 approximately parallel to the first circuit board assembly 300. A junction of the third section 30 and the fourth section 40 resists against a fourth extending section 307 of the second circuit board assembly 302. One end 309 of the third circuit board assembly 304 which is approximately parallel to the first circuit board assembly 300, is located on the third contact section 61 of the EMI spring contact 100.

Figure 5:
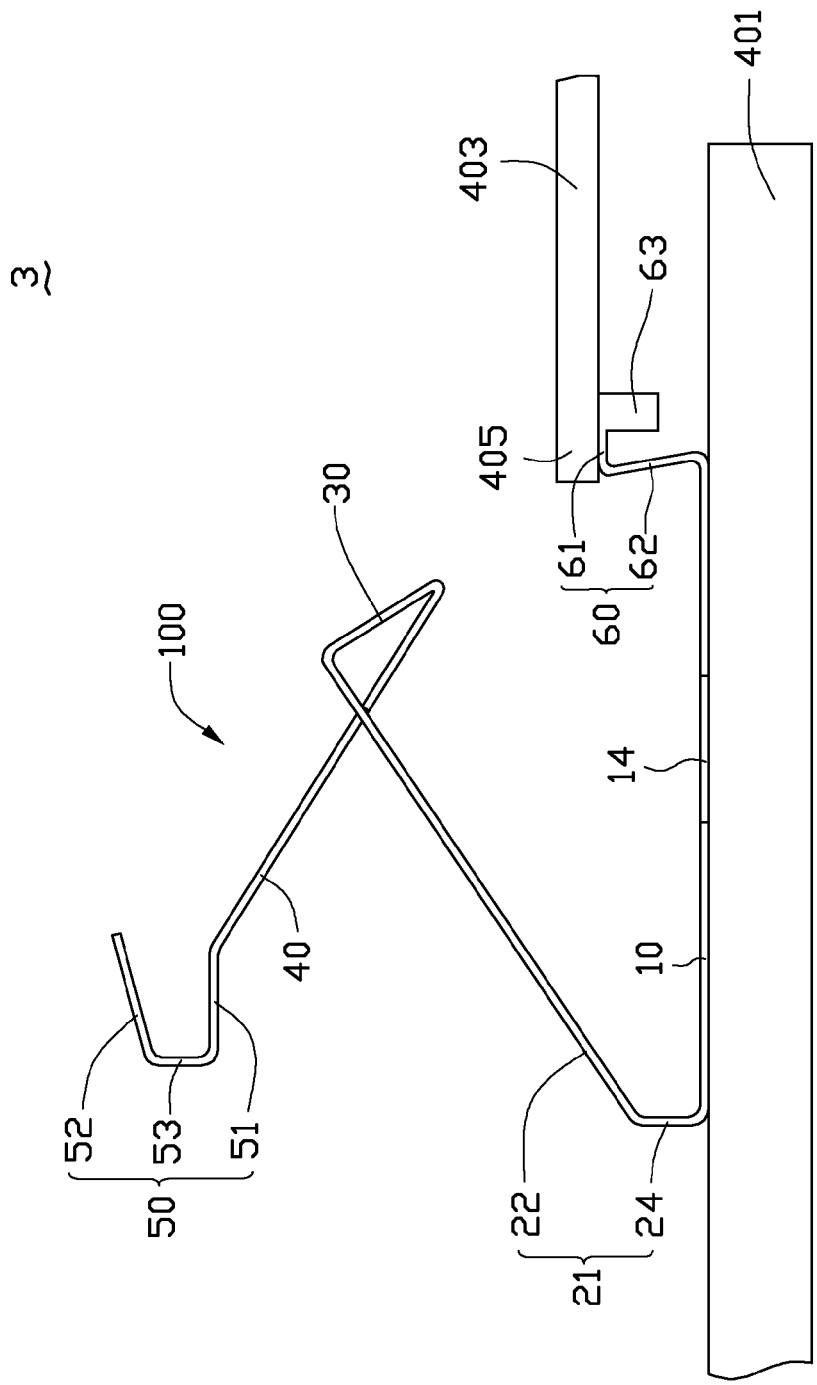
FIG. 5 is similar to FIG. 2, but showing an electronic device including the EMI spring contact of FIG. 1 in a third state.

Referring to FIG. 5, in a third state, an electronic device 3 includes a first circuit board assembly 401, a second circuit board assembly 403 and the EMI spring contact 100 connecting the first circuit board assembly 401 and the second circuit board assembly 403. The first section 10 of the EMI spring contact 100 is horizontally mounted on the first circuit board assembly 401, and solder is accommodated in the first through hole 13 to make the EMI spring contact 100 connect to the first circuit board assembly 401. The first contact section 51, the second contact section 52 and the third section 30 are all free standing. One end 405 of the second circuit board assembly 403 which is approximately parallel to the first circuit board assembly 401 is located on the third contact section 61 of the EMI spring contact 100.

Figure 6:
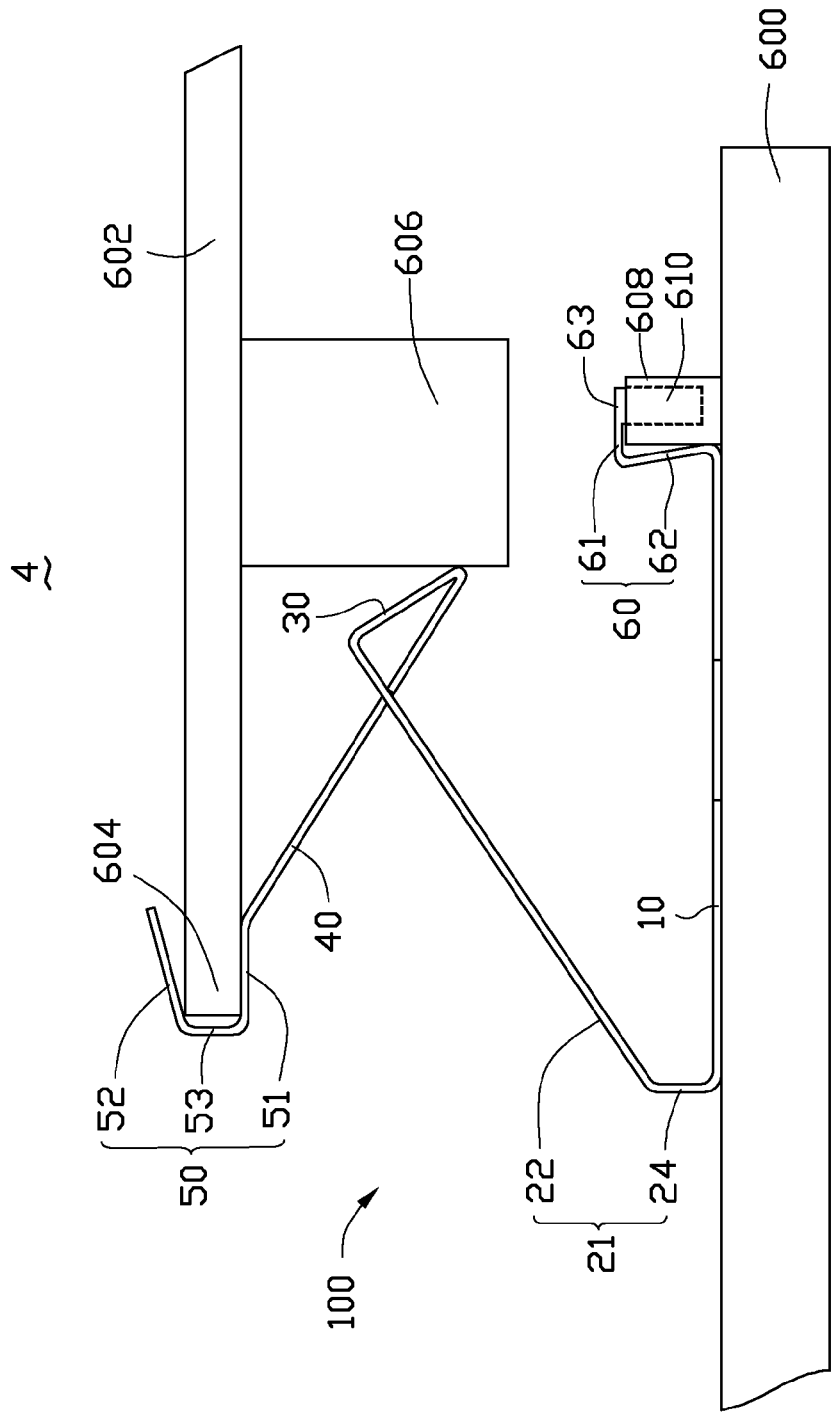
FIG. 6 is similar to FIG. 2, but showing an electronic device including the EMI spring contact of FIG. 1 in a fourth state.

Referring to FIG. 6, in a fourth state, an electronic device 4 includes a first circuit board assembly 600, a second circuit board assembly 602 and the EMI spring contact connecting the first circuit board assembly 600 and the second circuit board assembly 602. The first section 10 of the EMI spring contact 100 is horizontally mounted on the first circuit board assembly 600, and the structure of the first circuit board assembly 600 is the same as the first circuit board assembly 200 of FIG. 2. The first contact section 51 is associated with the second contact section 52 to hold one end 604 of the second circuit board assembly 602 approximately parallel to the first circuit board assembly 600. A junction of the third section 30 and the fourth section 40 resists against a fifth extending section 606 of the second circuit board assembly 602. A fifth extending section 608 is defined on the first circuit board assembly 600 and extends up from the surface of the first circuit board assembly 600. The fifth extending section 608 may be cuboid shaped. Two second grooves 610 (see also FIG. 3) are defined in the top surface of the fifth extending section 608. The two second extending section 63 of the EMI spring contact 100 are respectively plugged in the two second grooves 610 to make the EMI spring contact 100 be connected to the first circuit board assembly 600.

According to the structure of the EMI spring contact 100, it can overlap with several circuit board assemblies at the same time, and the EMI spring contact 100 contacts the circuit board assemblies and the outer object to form a shielding system for shielding the electronic device against EMI.

While various embodiments have been described and illustrated, the disclosure is not to be constructed as being limited thereto. Various modifications can be made to the embodiments by those skilled in the art without departing from the true spirit and scope of the disclosure as defined by the appended claims.

What is claimed is:

1. An EMI spring contact for impeding EMI radiation comprising:
   a first section having a first end and a second end opposite to the first end;
   a second section connected to the first section and extending up and angularly from the first end of the first section, wherein an acute angle is formed between the first and second sections, and a first through hole is defined in the second section;
   a third section connected to the second section and extending down from the second section; and
   a fourth section connected to the third section and extending up and angularly from the third section through the first through hole of the second section, the fourth section being movably received in the first through hole.

2. The EMI spring contact of claim 1, wherein the EMI spring contact further comprises a fifth section connected to the fourth section, the fifth section includes a first contact section, a second contact section and a first connecting section connecting the first contact section with the second contact section, the first contact section extends up and angularly from the fourth section, the first contact section is approximately parallel to the first section, the first connecting section extends vertically from the first contact section, the second contact section extends up and angularly from the first connecting section.

3. The EMI spring contact of claim 1, wherein the EMI spring contact further comprises a sixth section connected to the first section, the sixth section includes a third contact section and a second connecting section connecting the first section and the third contact section, the second connecting section extends up and angularly from the second end of the first section, the third contact section extends out from the second connecting section and the third contact section is substantially parallel to the first section.

4. The EMI spring contact of claim 1, wherein the second section includes a supporting section and a third connecting section connecting the supporting section and the first section, the third connecting section extends vertically from the first end of the first section, the supporting section extends up and angularly from the third connecting section, the first through hole is defined on one end of the supporting section away from the third connecting section, the first through hole is rectangular shaped.

5. The EMI spring contact of claim 3, wherein two first extending sections are vertically extended downwards from the two end sides of the third contact section respectively, the two first extending sections are configured to plug in a circuit board assembly.

6. The EMI spring contact of claim 4, wherein the first section is strip shaped, a second through hole is defined in the center of the first section, the second through hole is configured to hold holder to fix the EMI spring contact to a circuit board assembly, the second through hole is crisscross shaped, the first section further includes two second extending sections being respectively defined on the two opposite sides of the second through hole, the two second extending sections are configured to make the EMI spring contact connect with the circuit board assembly.

7. An electronic device comprising:
 a first circuit board assembly; and
 an EMI spring contact for impeding EMI radiation comprising:
  a first section having a first end and a second end opposite to the first end mounted on the first circuit board assembly;
  a second section connected to the first section and extending up and angularly from the first end of the first section, wherein an acute angle is formed between the first and second sections, and a first through hole is defined in the second section;
  a third section connected to the second section and extending down from the second section; and
  a fourth section connected to the third section, the fourth section extending up and angularly from the third section through the first through hole of the second section, the fourth section being movably received in the first through hole.

8. The electronic device of claim 7, wherein the electronic device further comprises a second circuit board assembly, the EMI spring contact further comprises a fifth section connected to the fourth section and connected to the second circuit board assembly, the fifth section includes a first contact section, a second contact section and a first connecting section connecting the first contact section and the second contact section, the first contact section extends out and horizontally from the fourth section, the first connecting section extends vertically from the first contact section, the second contact section extends up and angularly from the first connecting section.

9. The electronic device of claim 7, wherein the electronic device further comprises a third circuit board assembly, the EMI spring contact further comprises a sixth section connected to the first section, the sixth section includes a third contact section and a second connecting section connecting the first section and the third contact section, the second connecting section extends up and angularly from the second end of the first section, the third contact section extends out from the second connecting section and the third contact section is substantially parallel to the first section, the third circuit board assembly is mounted on the third contact section.

10. The electronic device of claim 9, wherein two first extending sections are vertically extended downwards from the two end side of the third contact section respectively, the two first extending sections are configured to plug into a circuit board assembly.

11. The electronic device of claim 10, wherein the first section is strip shaped, a second through hole is defined in the center of the first section, the second through hole is configured to hold holder to fix the EMI spring contact to a circuit board assembly, the second through hole is crisscross shaped, the first section further includes two second extending sections being respectively defined on the two opposite sides of the second through hole, the two second extending sections are configured to make the EMI spring contact connect with the circuit board assembly.

12. The electronic device of claim 10, wherein a third extending section is disposed on a surface of the first circuit board assembly and extends up from the surface of the first circuit board assembly, the third extending section is cuboid shaped, two grooves are defined in the top surface of the third extending section, the two first extending section are respectively plugged in the two grooves to connect the EMI spring contact to the first circuit board assembly.

13. The electronic device of claim 8, wherein the second contact section is connected to the second circuit board assembly.

14. The electronic device of claim 8, wherein the first contact section is associated with the second contact section to support the second circuit board assembly.

15. The electronic device of claim 8, wherein the second circuit board assembly includes a fourth extending section, the junction of the third section and the fourth section resists against the fourth extending section.

\* \* \* \* \*